United States Patent
Karlsson et al.

(10) Patent No.: US 11,959,954 B2
(45) Date of Patent: Apr. 16, 2024

(54) CONTACTLESS MICROSTRIP TO WAVEGUIDE TRANSITION

(71) Applicant: GAPWAVES AB, Gothenburg (SE)

(72) Inventors: Hanna Karlsson, Gothenburg (SE); Esperanza Alfonso Alós, Västra Frölunda (SE); Magnus Gustafsson, Alingsås (SE); Thomas Emanuelsson, Västra Frölunda (SE)

(73) Assignee: GAPWAVES AB, Gothenburg (SE)

( * ) Notice: Subject to any disclaimer, the term of this patent is extended or adjusted under 35 U.S.C. 154(b) by 284 days.

(21) Appl. No.: 17/285,125

(22) PCT Filed: Sep. 19, 2019

(86) PCT No.: PCT/EP2019/075096
§ 371 (c)(1),
(2) Date: Apr. 14, 2021

(87) PCT Pub. No.: WO2020/078652
PCT Pub. Date: Apr. 23, 2020

(65) Prior Publication Data
US 2021/0376439 A1 Dec. 2, 2021

(30) Foreign Application Priority Data
Oct. 19, 2018 (SE) .................................. 1830297-6

(51) Int. Cl.
*H01P 5/10* (2006.01)
*G01R 29/10* (2006.01)
(Continued)

(52) U.S. Cl.
CPC ............. *G01R 29/10* (2013.01); *H01P 5/107* (2013.01); *H01Q 9/0407* (2013.01); *H01Q 21/005* (2013.01); *H01Q 13/10* (2013.01)

(58) Field of Classification Search
CPC ............. H01P 5/107; H01P 3/121–123; H01Q 9/0407; H01Q 21/0043; H01Q 21/005; H01Q 13/10; H01Q 21/065
See application file for complete search history.

(56) References Cited

U.S. PATENT DOCUMENTS

| 6,573,803 B1 | 6/2003 | Ziegner |
| 7,265,558 B1 | 9/2007 | Penndal |

(Continued)

FOREIGN PATENT DOCUMENTS

| CN | 207303311 | 5/2018 |
| JP | H07-263887 | 10/1995 |
| WO | 2018/067046 | 4/2018 |

OTHER PUBLICATIONS

International Search Report issued in PCT/EP2019/075096, dated Sep. 12, 2019, pp. 1-2.

(Continued)

*Primary Examiner* — Hasan Islam
(74) *Attorney, Agent, or Firm* — Jeffrey S. Melcher; Melcher Patent Law PLLC

(57) ABSTRACT

A microstrip to waveguide transition comprising a waveguide module and a section of printed circuit board (PCB). The waveguide module comprises a waveguide aperture and a repetitive structure, the waveguide aperture being arranged extending through the module for attaching a waveguide to an external side of the module, the repetitive structure comprising a plurality of protruding elements arranged to surround the waveguide aperture on an internal side of the module and to define a passage into the waveguide aperture on the internal side, wherein the repetitive structure is configured to attenuate electromagnetic signal propagation in a frequency band past the repetitive structure while allowing propagation via the passage, the transition further (Continued)

comprising a PCB with a patch antenna connected to a transmission line and arranged to face the passage into the waveguide aperture.

12 Claims, 4 Drawing Sheets

(51) Int. Cl.
```
   H01P 5/107     (2006.01)
   H01Q 9/04      (2006.01)
   H01Q 21/00     (2006.01)
   H01Q 13/10     (2006.01)
```

(56) References Cited

U.S. PATENT DOCUMENTS

| | | | |
|---|---|---|---|
| 2018/0269168 A1* | 9/2018 | Mizuno | H01L 23/66 |
| 2018/0269557 A1* | 9/2018 | Fangfang | H01Q 1/50 |
| 2018/0375219 A1* | 12/2018 | Kirino | H01P 5/12 |

OTHER PUBLICATIONS

Written Opinion issued in PCT/EP2019/075096, dated Sep. 12, 2019, pp. 1-7.
International Search Report issued in PCT/EP2019/075097, dated Sep. 12, 2019, pp. 1-4.
Written Opinion issued in PCT/EP2019/075097, dated Sep. 12, 2019, pp. 1-7.
Artemenko A et al: "Design of wideband waveguide to microstrip transition for 60 GHz frequency band", Microwave Conference (EUMC), 2011 41st European, IEEE, Oct. 10, 2011 (Oct. 10, 2011), pp. 838-841.
Seo K et al: "Microstrip-to-waveguide transition using waveguide with large broad-wall in millimeter-wave band", Ultra-Wideband (ICUWB), 2010 IEEE International Conference on, IEEE, Piscataway, NJ, USA, Sep. 20, 2010 (Sep. 20, 2010), pp. 1-4.
Brazalez Astrid Algaba et al: Design and Validation of Microstrip Gap Waveguides and Their Transitions to Rectangular Waveguide, for Millimeter-Wave Applications11 , IEEE Tran Sa Cti Ons on Microwave Theory and Techniques, Plenum, USA, vol. 63, No. 12, Nov. 6, 2015 (Nov. 6, 2015), pp. 4035-4050.
Raza Hasan et al: "Microstrip-Ridge Gap Waveguide-Study of Losses, Bends, and Transition to W", IEEE Transactions on Microwave Theory and Techniques, Plenum, USA, vol. 62, No. 9, Jun. 9, 2014 (Jun. 9, 2014), pp. 1943-1952, XP011557625.
Cao Baolin et al: "W-Band High-Gain TE$ (220)$-Mode Slot Antenna Array With Gap-Waveguide Feeding Network", IEEE Antennas and Wireless Propagation Letters, vol. 15, Oct. 12, 2015 (Oct. 12, 2015), pp. 988-991.
Rahiminejad Sofia et al: "Polymer Gap Adapter for Contactless, Robust, and Fast Measurements at 220-325GHz", Journal of Microelectromechanical Systems, IEEE Service Center, US, vol. 25, No. 1, Feb. 1, 2016 (Feb. 1, 2016), pp. 160-169.
Rahiminejad S et al:Micromachinedcontactless pin-flange adapter for robust high-frequency measurements 11 , Journal of Micromechanics & Microengineering, Institute of Physics Publishing, Bristol, GB, vol. 24, No. 8, Jul. 22, 2014 (Jul. 22, 2014), p. 84004, XP020268128, ISSN: 0960-1317.
Office Action issued in corresponding Japanese Patent Application No. 2021-519831, dated Jun. 21, 2022, pp. 1-8, 1 translation pp. 1-7.
First Office Action issued in corresponding Chinese Patent Application No. 201980065041, dated Aug. 4, 2021, pp. 1-24.
Second Office Action issued in corresponding Chinese Patent Application No. 201980065041, dated Mar. 9, 2022, pp. 1-8.

* cited by examiner

CONTACTLESS MICROSTRIP TO WAVEGUIDE TRANSITION

TECHNICAL FIELD

The present disclosure relates to wireless communication systems in general, and to waveguide transmission mediums in particular. There are disclosed arrangements to transit a signal from a microstrip transmission medium to a tubular waveguide transmission medium.

BACKGROUND

Wireless communication networks comprise radio frequency transceivers, such as radio base stations used in cellular access networks, microwave radio link transceivers used for, e.g., backhaul into a core network, and satellite transceivers which communicate with satellites in orbit. Radar transceivers also comprise radio frequency transceivers for transmitting and receiving radio frequency signals.

A transmission medium is used to transport radio frequency signals to and from the radio frequency transceiver. A common type of transmission medium are waveguide structures. The term waveguide may refer to any linear structure that conveys electromagnetic waves between its endpoints. Waveguides are often implemented as hollow metal pipes or metallized tubular structures, and are commonly used at microwave frequencies, for such purposes as connecting microwave transmitters and receivers to their antennas.

A special type of waveguide transmission medium is a microstrip. A microstrip is a type of electrical transmission line which can be fabricated using printed circuit board (PCB) technology, and which is used to convey microwave-frequency signals. It consists of a conducting strip separated from a ground plane by a dielectric layer. Microwave components such as antennas, couplers, filters, power dividers etc. can be formed from microstrip, with the entire device existing as the pattern of metallization on the substrate. Microstrip is one of many forms of planar transmission lines, others include stripline and coplanar waveguides, and it is possible to integrate all of these on the same substrate.

It is often desired to transition to and from a tubular waveguide, e.g., between a microstrip transmission medium and a rectangular waveguide. Such transitions often comprise probes or the like extending into the waveguide structure.

U.S. Pat. No. 7,265,558 B1 discloses a waveguide transition using feeding probes.

U.S. Pat. No. 6,573,803 B1 discloses a microstrip to waveguide transition based on ridges.

Feeding probes and ridges must be carefully positioned in the waveguide structure in order to not degrade overall performance of the transition. The precision requirements tend to increase with frequency, since higher frequencies of operation often imply smaller sized components. Such high requirements on precision complicates assembly and drives cost.

There is a need for high performance transition arrangements which allow for efficient assembly of waveguide transitions during manufacturing.

SUMMARY

It is an object of the present disclosure to provide new transition arrangements for transitioning between microstrip and tubular waveguides which offer high performance in terms of, e.g., return loss and insertion loss, while allowing for efficient and convenient assembly of waveguide transitions during manufacturing.

This object is at least in part obtained by a waveguide module for a microstrip to waveguide transition arranged to interface with a PCB comprising a patch antenna. The module comprises a waveguide aperture and a repetitive structure. The waveguide aperture is arranged extending through the module for attaching a waveguide to an external side of the module. The repetitive structure comprises a plurality of protruding metal or metallized elements arranged to surround the waveguide aperture on an internal side of the module and to define a passage into the waveguide aperture on the internal side, wherein the repetitive structure is configured to attenuate electromagnetic signal propagation in a frequency band past the repetitive structure while allowing propagation via the passage.

The aperture acts as an interface to a waveguide structure, such as a tubular waveguide attached to the external side of the module while the passage allows for a patch antenna arranged on the PCB to radiate into the waveguide and also to pick up radio signals exiting the waveguide. The repetitive structure realizes a gap waveguide structure which efficiently seals the passage such that electromagnetic energy can pass more or less unhindered between the waveguide and the patch antenna, but not in any other direction. The transition between PCB and waveguide is therefore contactless in that no electrical contact is required between the waveguide and the microstrip on the PCB. This is an advantage since high precision assembly of, e.g., probes and the like are not necessary; The PCB is simply attached to the waveguide module with fastening means such as bolts or the like, electrical contact need not be verified since the repetitive structure seals the transition in a contactless manner.

According to some aspects, the repetitive structure is integrally formed with a flange of the waveguide. The repetitive structure may, e.g., be machined directly into a metal element forming the interface towards the waveguide and comprising the waveguide aperture. This is an advantage since such machining can be performed in a cost-effective manner with high mechanical precision. This type of integrally formed repetitive structure is also mechanically stable, which is an advantage.

According to some other aspects, the repetitive structure is configured on a separate carrier assembled with the waveguide module. This way the repetitive structure can be configured separately from the other parts of the waveguide module according to the frequency band of operation. During assembly, a kit of different repetitive structures with different dimensions can be available, and a suitable repetitive structure selected for the current operating scenario. It is an advantage that the other parts of the waveguide module can be re-used.

According to further aspects, the waveguide module comprises one or more alignment holes configured to receive respective alignment taps soldered to the PCB. This alignment 'tap and hole' configuration provides for an increased alignment precision and simplifies assembly of the waveguide module with the PCB.

There is also disclosed herein a PCB, or section of PCB, comprising a patch antenna connected to a transmission line such as a microstrip transmission line. The PCB is arranged to interface with a waveguide module comprising a passage through a repetitive structure into a waveguide aperture. The patch antenna is configured to face the passage into the waveguide aperture.

The PCB thus, together with the waveguide module, forms a high-performance transition between a transmission line such as a microstrip and a waveguide. The transition allows for cost-efficient assembly since it is contactless and does not require soldering during assembly.

According to aspects the PCB comprises at least one alignment tap soldered to the PCB at a location relative to the patch antenna and arranged to enter a respective alignment hole on the waveguide module.

As noted above, this alignment 'tap and hole' configuration provides for an increased alignment precision and simplifies assembly of the waveguide module with the PCB. As will be explained in the following, the soldering of the alignment tap allows for high mechanical precision in the placement of the tap relative to the patch antenna, which is an advantage.

There are also disclosed herein microstrip to waveguide transitions and methods associated with the above-mentioned advantages.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

The present disclosure will now be described more in detail with reference to the appended drawings, where.

DETAILED DESCRIPTION

The invention will now be described more fully hereinafter with reference to the accompanying drawings, in which certain aspects of the invention are shown. This invention may, however, be embodied in many different forms and should not be construed as limited to the embodiments and aspects set forth herein; rather, these embodiments are provided by way of example so that this disclosure will be thorough and complete, and will fully convey the scope of the invention to those skilled in the art. Like numbers refer to like elements throughout the description.

Herein, the term waveguide refers to a metallized tubular structure unless otherwise explicitly noted. For instance, the metallized tubular structure may be a circular, elliptical or rectangular cross-section waveguide. A waveguide may also refer to other known waveguide structures, such as arrangements comprising a ridge, a double ridge, or the like.

The term microstrip herein denotes a planar transmission medium in general. Thus, for instance, strip-lines and the like are included when referring to microstrips unless otherwise noted.

As communication frequency bands go higher and higher, transmission components become smaller and smaller. This is because the size of many components, such as waveguides and filters are determined in proportion to a wavelength of the carrier frequency. This complicates manufacturing of transmission components since higher and higher mechanical precision is required in order to obtain satisfactory performance.

A radio or radar transceiver is generally comprised in one or more integrated circuits arranged on a section of printed circuit board (PCB). The transceiver transmits and receives signals via ports in the integrated circuits. The ports are often connected to one or more antenna devices via microstrip on the PCB. It is often desired to transition the microstrip signals to and from a waveguide interface. This transition is critical for performance of the overall system.

A central concept herein is the use of repetitive structures for attenuating electromagnetic fields. Such repetitive structures are often referred to as 'gap waveguide structures' in the literature. A gap waveguide is generally built up of two parts; a structured metal surface and a flat metal surface being placed in close proximity to one another, but not necessarily in direct contact. The structured surface is characterized by pins or other protrusions forming a metamaterial surface sometimes referred to as an artificial magnetic conductor. The protrusions create a barrier preventing the electromagnetic waves from propagating in undesired directions. In this way, the pins replace the walls in rectangular waveguides. This is done without requiring a perfectly sealed metallic enclosure, which is an advantage.

Figure 1:
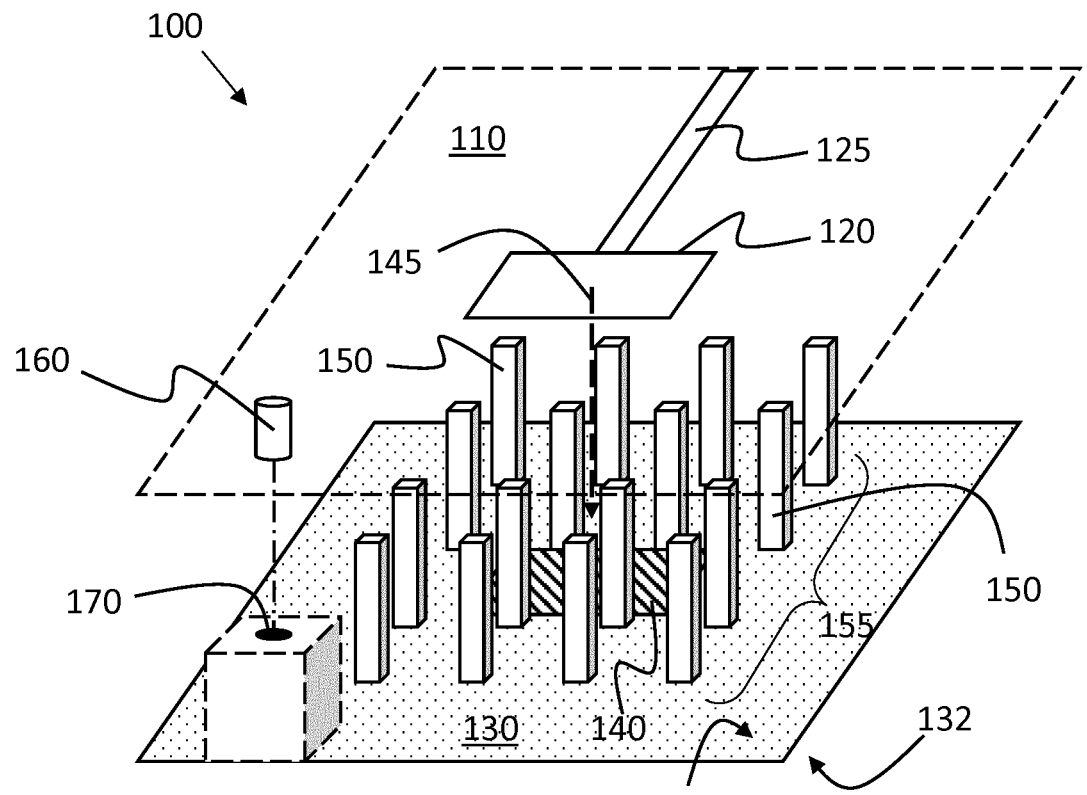
FIG. 1 schematically shows a section of PCB and a waveguide module.

FIG. 1 schematically shows a section of PCB 110 and a waveguide module 130. The waveguide module 130 and the section of PCB are separate entities arranged to be attached to each other. A signal input on a microstrip transmission line 125 is radiated by a patch antenna 120 arranged on the PCB 110. Microstrip transmission lines and patch antennas are known and will not be discussed in detail here. However, the skilled person realized that a ground plane is configured on a back side of the patch antenna 120, which ground plane is not shown in FIG. 1. The patch antenna and microstrip transmission line are of course bi-directional, which means that signal input to the transmission line will be radiated from the patch, which incoming electromagnetic signals will be picked up by the patch antenna 120 and thus output on the transmission line 125.

The waveguide module 130 is arranged to interface with a section of PCB comprising a patch antenna 120. The module comprises a waveguide aperture 140 and a repetitive structure 155. The waveguide aperture 140 is arranged extending through the module 130. A tubular waveguide, such as a circular, elliptical or rectangular waveguide can be attached to an external side 132 of the waveguide module. For instance, the waveguide module may comprise, or be integrally formed from, a waveguide flange machined from, e.g., a piece of metal such as aluminum or the like. The repetitive structure 155 comprises a plurality of protruding metal or metallized elements 150 arranged to surround the waveguide aperture 140 on an internal side 131 of the module and to define a passage 145 into the waveguide aperture 140 on the internal side 131.

The section of PCB 110 comprises a patch antenna 120 connected to a transmission line 125. The PCB is arranged to interface with a waveguide module 130 comprising a passage 145 through a repetitive structure 155 into a waveguide aperture 140. The patch antenna 120 is configured to face the passage 145 into the waveguide aperture 140.

According to the discussion above, the protruding elements 150 together with a ground plane of the PCB 110 constitute the two parts of a gap waveguide structure; the protruding elements make up the structured metal surface which is placed in close proximity to the ground plane metal surface of the PCB. Here, close proximity means that the distance is smaller than a quarter of the operation wavelength. It is appreciated that the repetitive structure is a periodic or quasi-periodic structure. Consequently, the protrusions create a barrier preventing the electromagnetic waves from propagating in undesired directions. The dimensions of the protruding element and their relative configuration determine the frequency dependent attenuation properties of the repetitive structure. Here, the undesired directions are the directions leading away from the passage 145 between the patch antenna 120 and the waveguide aperture 140. Thus, the repetitive structure 155 is configured to attenuate electromagnetic signal propagation in a frequency band past the repetitive structure while allowing propagation via the passage 145.

According to aspects, the repetitive structure 155 is a pin structure comprising conducting pins, e.g., metal or metalized pins, arranged periodically protruding from a conducting plane comprised in the waveguide module. The conducting pins may, e.g., be formed as rectangular or cylindrical protrusions. However, it is realized that many different shapes can be used with similar effect. For instance, mushroom-type protrusions or conical shape protrusions can also be used with the same or similar effect.

According to an example, the waveguide module comprises a waveguide flange extending in a plane perpendicular to the waveguide aperture 140. In this case the repetitive structure 155 is preferably integrally arranged with the waveguide flange. The respective structure may for instance be milled or otherwise machined from the same piece of metal that make up the waveguide flange.

However, the repetitive structure 155 need not necessarily be integrally formed with the metal forming the waveguide aperture. For instance, according to some aspects, the repetitive structure 155 is configured on a separate carrier assembled with the waveguide module.

The separate carrier may, e.g., be a piece of Polytetrafluoroethylene (PTFE) which is a synthetic fluoropolymer of tetrafluoroethylene. PTFE can be molded with high precision to form the protrusions and to fit into a machined grove or recess formed in connection to the waveguide aperture. It is realized that any type of dielectric or plastic material can be used for this insert. The insert can be metallized, thus forming the repetitive structure 155 configured to attenuate electromagnetic signal propagation in a frequency band past the repetitive structure while allowing propagation via the passage 145.

An advantage of using a separate carrier for the repetitive structure is that the dimensions of the repetitive structure can be selected based on application, while the other parts of the waveguide module can be re-used, at least if a bushing member is configured in the waveguide aperture to form the correct size aperture for the frequency band of operation.

The repetitive structure can also be formed on the section of PCB, i.e., extending from the PCB 110 down into the waveguide module 130.

The patch antenna 120 radiates into the waveguide aperture via the passage 145 to form the transition. Thus, there is a need for alignment between the patch antenna and the waveguide aperture 140. In case of misalignment a loss of performance in terms of, e.g., return loss and insertion loss can be expected. Some alignment is of course obtained by the conventional fastening means used to hold the PCB 110 to the waveguide module 130. However, the mechanical tolerances may be prohibitively large for normal manufacturing processes.

To improve alignment between patch antenna and waveguide aperture 140, one or more alignment holes 170 may optionally be configured to receive respective alignment taps 160 soldered to the PCB 110. The soldering process is associated with a self-alignment effect; During assembly on a PCB, first solder paste is deposited on pads arranged with high mechanical precision the PCB. In a second step surface mounted components are placed on the pads. The third step is a re-melting of the solder, where the solder joints are formed. During re-melting, forces from surface tension and capillary effects acts on the surface mounted component to align the component with the older pads on the PCB. Thus, soldered alignment taps can be expected to be placed with high accuracy relative to the patch antenna on the PCB.

Thus, according to aspects, the PCB 110 comprises at least one alignment tap 160 soldered to the PCB at a location relative to the patch antenna 120 and arranged to enter a respective alignment hole on the waveguide module 130. It is appreciated that a single alignment tap provides one fixed point, i.e., the PCB may then rotate in relation to the waveguide module. Two or more alignment taps with respective holes machined in the waveguide module will fix the patch antenna 120 in relation to the waveguide aperture 140 and passage 145.

Figure 2:
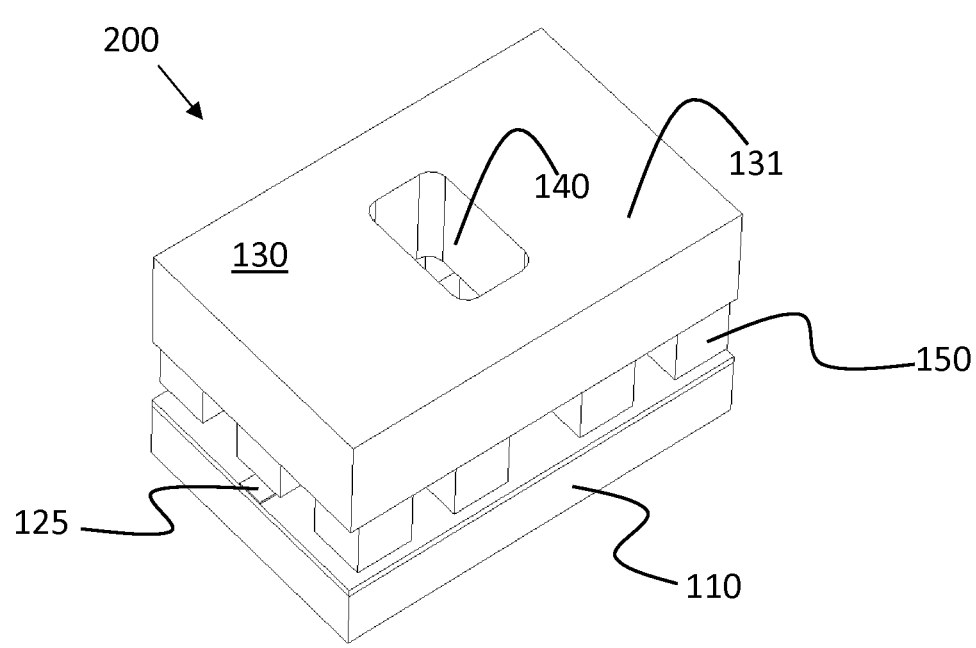
FIG. 2 schematically illustrates an assembled waveguide transition.

FIG. 2 schematically illustrates an assembled microstrip to waveguide transition 200. The external side 131 of the waveguide module 130 is visible with the waveguide aperture for attaching the waveguide. The microstrip, i.e., the transmission line 125 is visible entering the transition 200. The protruding pins 150 forming the repetitive structure can also be seen. Here, a rectangular waveguide aperture is used. However, other waveguide types are equally applicable.

Figure 3:
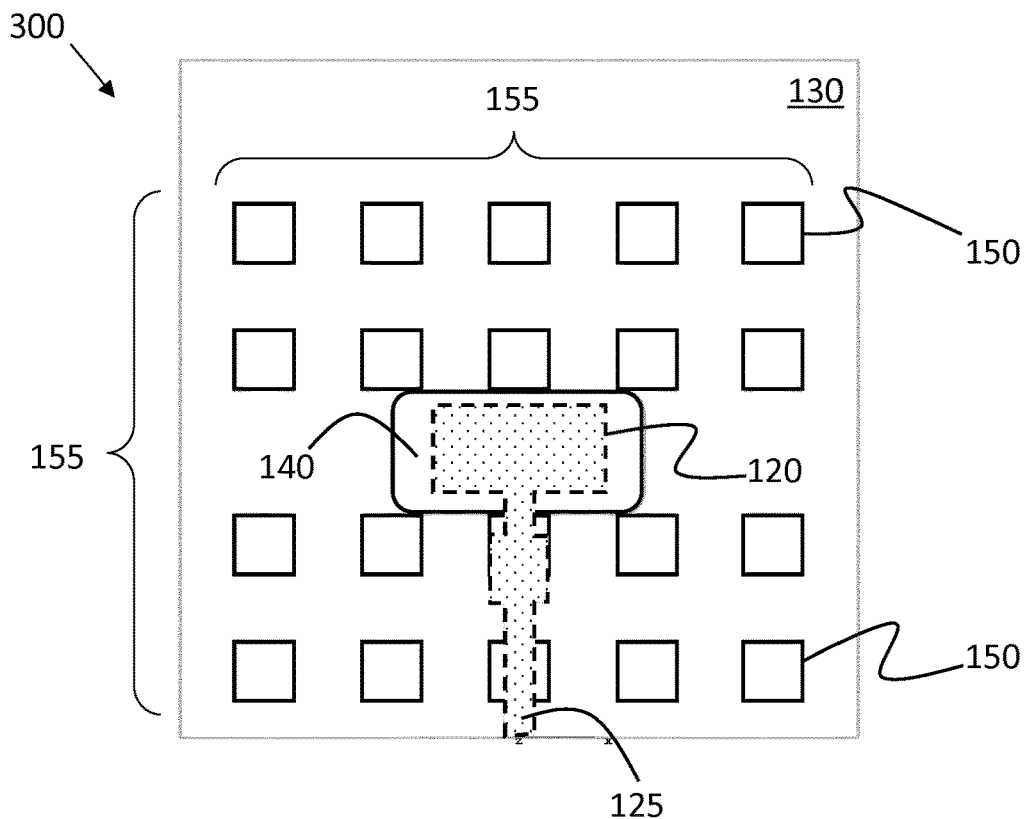
FIG. 3 shows a patch antenna arranged facing a waveguide aperture.

FIG. 3 shows a top view of a patch antenna 120 arranged facing a waveguide aperture 140. Here the transmission line 125 comprises a smaller patch arranged prior to the larger patch constituting the antenna. It is appreciated that any number of microstrip designs, including filters and the like, can be arranged in the transmission line 125 in connection to the patch antenna 120. The patch antenna is aligned with the passage leading to the waveguide aperture 140. Thus, radiated electromagnetic energy enters the waveguide attached to the external side of the waveguide module 130 to complete he microstrip to waveguide transition. The protruding elements 150 are shown making up the repetitive structure 155.

Figure 4:
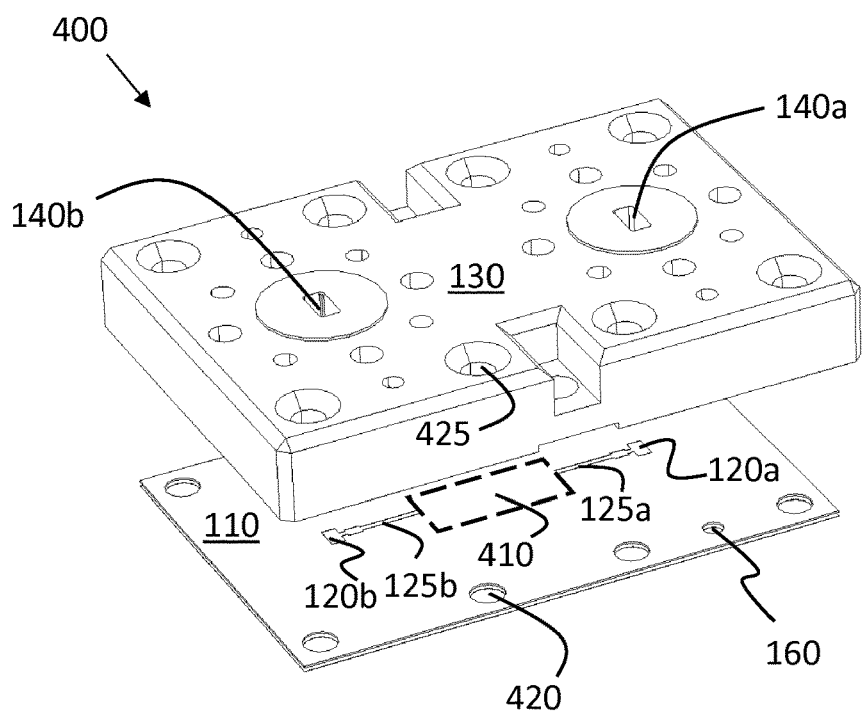
FIG. 4 illustrates a waveguide transition comprising a plurality of apertures.

FIG. 4 illustrates an example waveguide transition 400 comprising a plurality of waveguide apertures. A circuit 410, such as a radio transceiver or radar transceiver, or other integrated circuit, is shown arranged on the PCB 110. A first transmission line 125a and a second transmission line 125b extends from the circuit 410 to a first patch antenna 120a and to a second patch antenna 120b, respectively. Thus, two waveguide transitions are integrated in a single unit. Such microstrip to waveguide transitions are suitable for, e.g., multiple-input multiple-output (MIMO) transceiver systems, and also or back to back testing circuits.

FIG. 4 also exemplifies fastening means 420, 425, here shown as holes in which bolts can be arranged to fixedly hold the PCB to the waveguide module 130. Such fastening means do provide a level of alignment between the patch antennas and the waveguide apertures. However, in case additional mechanical precision is wanted, one or more alignment taps 160 can be arranged on the PCB as discussed above.

Figure 5:
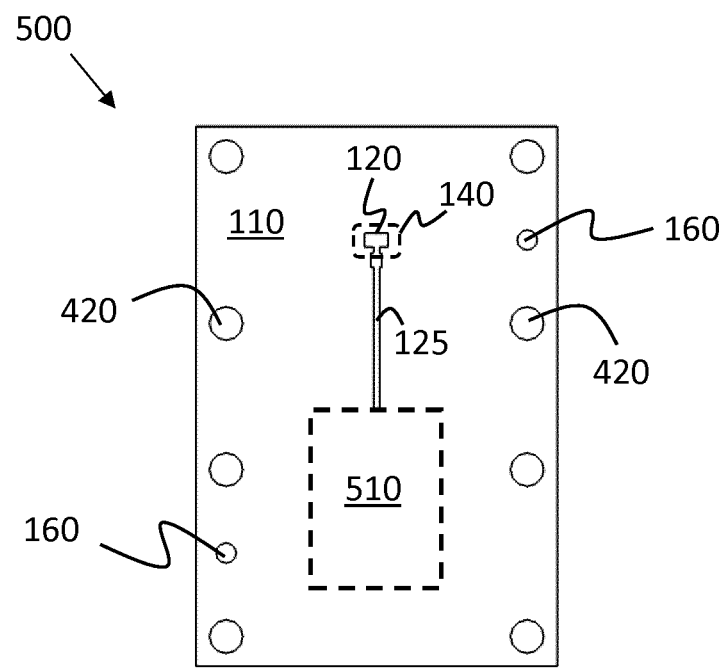
FIG. 5 shows a section of PCB comprising a patch antenna.

FIG. 5 shows a top view of a section of PCB comprising a patch antenna. This PCB comprises fastening means 420 as well as alignment taps 160. The PCB shown in FIG. 5 also comprises an integrated circuit, such as a radio or radar transceiver circuit.

Figure 6:
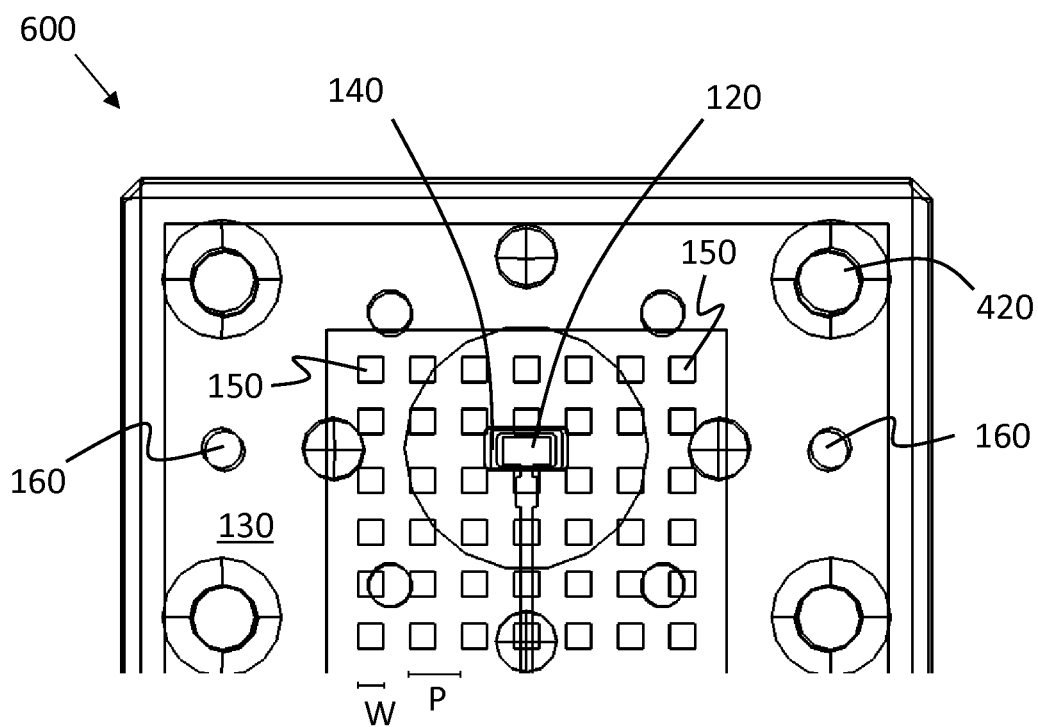
FIG. 6 schematically illustrates a waveguide transition.

FIG. 6 schematically illustrates a waveguide transition according to the above discussion. In order to exemplify, the dimensions of the waveguide transition are;

Waveguide 120 long side=3.0988 mm, waveguide 120 short side=1.5494 mm, pin 150 height=1 mm, pin period P=1.94 mm, pin width W=0.95 mm, distance from pin to substrate=0.1 mm, microstrip patch width=1.78 mm, microstrip patch length=1.04 mm, matching double stub length=1 mm, matching double stub width=0.79 mm, distance from stub to patch 0.43 mm.

Figure 7:
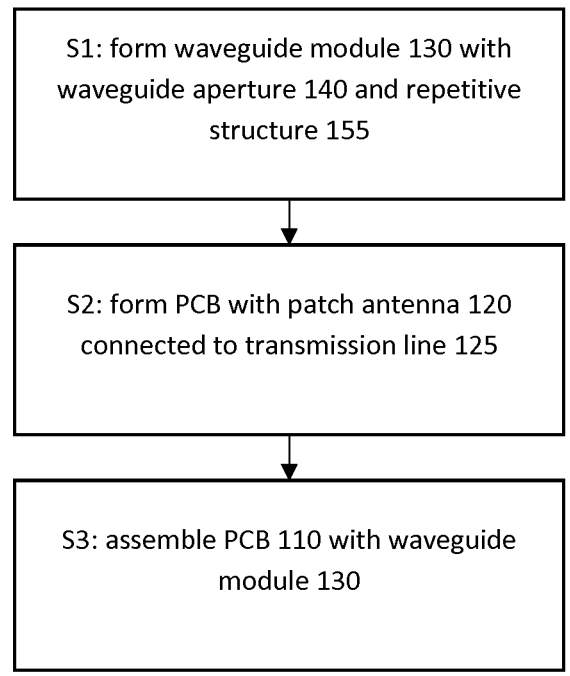
FIG. 7 is a flowchart illustrating methods.

FIG. 7 is a flowchart illustrating methods. There is illustrated a method comprising;

Forming S1 a waveguide module 130 for a microstrip to waveguide transition, the module comprising a waveguide aperture 140 and a repetitive structure 155, the waveguide aperture arranged extending through the module for attaching a waveguide to an external side 132 of the module, the repetitive structure 155 comprising a plurality of protruding metal or metallized elements 150 arranged to surround the waveguide aperture 140 on an internal side 131 of the module and to define a passage 145 into the waveguide aperture 140 on the internal side 131, wherein the repetitive structure 155 is configured to attenuate electromagnetic signal propagation in a frequency band past the repetitive structure while allowing propagation via the passage 145.

The method also comprises forming S2 a PCB 110 comprising a patch antenna 120 connected to a transmission line 125, wherein the PCB is arranged to interface with the waveguide module 130 comprising the passage 145 through the repetitive structure 155 into the waveguide aperture 140, and assembling S3 the PCB with the waveguide module such that the patch antenna 120 faces the passage 145 into the waveguide aperture 140.

Figures 8A, 8B, 8C, 8D:
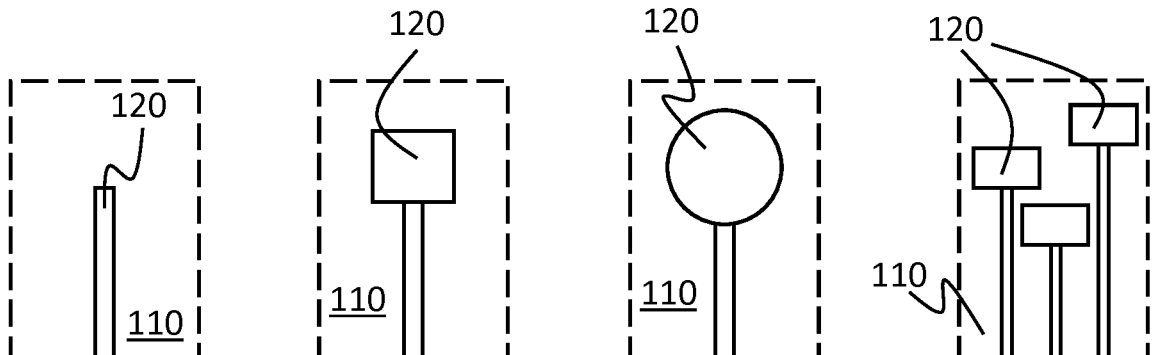
FIGS. 8A-8D illustrate example patch antennas.

FIGS. 8A to 8D schematically illustrate some example patch antennas 120. FIG. 8A shows an open-ended stub used as patch antenna, i.e., a piece of microstrip which is terminated in a stub. FIG. 8B shows another example patch antenna with a rectangular element arranged at the end o the microstrip transmission line. The element can have many different shapes, such as disc-shaped, which is shown in FIG. 8C.

The patch antenna 120 may comprise a plurality of antenna elements to form an antenna array. This antenna array may be used to shape a transmission lobe of the patch antenna to better fit into the waveguide aperture. The antenna array can also be electrically steerable, which allows for calibration of the waveguide transition during or after manufacturing and/or assembly.

The invention claimed is:

1. A microstrip to waveguide transition comprising:
a waveguide module; and
a printed circuit board (PCB),
wherein the module is arranged to interface with the PCB, the PCB comprising a patch antenna and a ground plane, the module comprising a waveguide aperture and a repetitive structure, the waveguide aperture arranged extending through the module for attaching a waveguide to an external side of the waveguide module, the repetitive structure comprising a plurality of protruding metal or metallized elements arranged to surround the waveguide aperture on an internal side of the module and to define a passage into the waveguide aperture on the internal side,
wherein the repetitive structure is configured to attenuate electromagnetic signal propagation in a frequency band past the repetitive structure while allowing propagation via the passage,
wherein the repetitive structure and ground plane constitute a gap waveguide structure, and
wherein the repetitive structure is arranged at a distance from the ground plane, where the distance is smaller than a quarter of an operation wavelength of the waveguide module.

2. The microstrip to waveguide transition according to claim 1, wherein the repetitive structure is a pin structure comprising conducting pins arranged periodically protruding from a conducting plane comprised in the waveguide module.

3. The microstrip to waveguide transition according to claim 1, wherein the waveguide module further comprises a waveguide flange extending in a plane perpendicular to the waveguide aperture, wherein the repetitive structure is integrally arranged with the waveguide flange.

4. The microstrip to waveguide transition according to claim 1, wherein the repetitive structure is configured on a separate carrier assembled with the waveguide module.

5. The microstrip to waveguide transition according to claim 1, wherein the waveguide aperture is arranged to interface on the external side of the module with any of; a rectangular waveguide, an elliptical waveguide, or a circular waveguide.

6. The microstrip to waveguide transition according to claim 1, wherein the waveguide module is arranged to interface with a section of the PCB, comprising the patch antenna configured to face the passage into the waveguide aperture.

7. The microstrip to waveguide transition according to claim 1, wherein the waveguide module comprises one or more alignment holes configured to receive respective alignment taps soldered to the PCB.

8. The microstrip to waveguide transition according to claim 1, wherein the PCB comprises an integrated circuit.

9. The microstrip to waveguide transition according to claim 1, wherein the patch antenna comprises a plurality of antenna elements.

10. The microstrip to waveguide transition according to claim 1, wherein the waveguide module comprises a plurality of waveguide apertures, wherein each waveguide aperture is arranged to interface a different patch antenna.

11. The microstrip to waveguide transition according to claim 1, wherein the PCB further comprises at least one alignment tap soldered to the PCB at a location relative to the patch antenna and arranged to enter a respective alignment hole on the waveguide module.

12. A radio or radar transceiver comprising a microstrip to waveguide transition comprising:
a waveguide module; and
a printed circuit board (PCB), wherein the module is arranged to interface with the PCB, the PCB comprising a patch antenna and a ground plane, the module comprising a waveguide aperture and a repetitive structure, the waveguide aperture arranged extending through the module for attaching a waveguide to an external side of the waveguide module, the repetitive structure comprising a plurality of protruding metal or metallized elements arranged to surround the waveguide aperture on an internal side of the module and to define a passage into the waveguide aperture on the internal side, wherein the repetitive structure is configured to attenuate electromagnetic signal propagation in a frequency band past the repetitive structure while allowing propagation via the passage, and wherein the repetitive structure and ground plane constitute a gap waveguide structure, and wherein the repetitive structure is arranged at a distance from the ground plane, where the distance is smaller than a quarter of an operation wavelength of the waveguide module.

\* \* \* \* \*